US012724347B2

(12) United States Patent
Ogata et al.

(10) Patent No.: US 12,724,347 B2
(45) Date of Patent: Sep. 1, 2026

(54) COMPOSITION FOR FORMING RESIST UNDERLAYER FILM

(71) Applicant: NISSAN CHEMICAL CORPORATION, Tokyo (JP)

(72) Inventors: Hiroto Ogata, Toyama (JP); Tomotada Hirohara, Toyama (JP); Hirokazu Nishimaki, Toyama (JP); Makoto Nakajima, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 888 days.

(21) Appl. No.: 17/916,307

(22) PCT Filed: Mar. 18, 2021

(86) PCT No.: PCT/JP2021/011230

§ 371 (c)(1),
(2) Date: Sep. 30, 2022

(87) PCT Pub. No.: WO2021/200241

PCT Pub. Date: Oct. 7, 2021

(65) Prior Publication Data

US 2023/0137360 A1 May 4, 2023

(30) Foreign Application Priority Data

Mar. 30, 2020 (JP) ................................ 2020-060494

(51) Int. Cl.

| | |
|---|---|
| ***G03F 7/11*** | (2006.01) |
| ***C08G 63/20*** | (2006.01) |
| ***C09D 167/03*** | (2006.01) |
| ***G03F 7/09*** | (2006.01) |
| ***G03F 7/20*** | (2006.01) |
| ***G03F 7/26*** | (2006.01) |
| ***H10P 76/20*** | (2026.01) |

(52) U.S. Cl.

CPC ................ *G03F 7/11* (2013.01); *C08G 63/20* (2013.01); *C09D 167/03* (2013.01); *H10P 76/2041* (2026.01); *G03F 7/091* (2013.01); *G03F 7/094* (2013.01); *G03F 7/20* (2013.01); *G03F 7/26* (2013.01)

(58) Field of Classification Search

None

See application file for complete search history.

(56) References Cited

U.S. PATENT DOCUMENTS

| | | | | |
|---|---|---|---|---|
| 10,191,374 B2 * | 1/2019 | Nishimaki | G03F 7/094 | |
| 11,242,194 B2 * | 2/2022 | Rogers | B65D 85/68 | |
| 2004/0241577 A1 | 12/2004 | Hatakeyama et al. | | |
| 2011/0086310 A1 * | 4/2011 | Yukawa | G03F 7/094 | 430/326 |
| 2012/0292487 A1 * | 11/2012 | Yukawa | C07D 405/14 | 430/326 |
| 2016/0218013 A1 * | 7/2016 | Ohashi | G03F 7/038 | |
| 2018/0081274 A1 * | 3/2018 | Ogata | C08G 59/20 | |
| 2018/0181001 A1 * | 6/2018 | Endo | G03F 7/16 | |

(Continued)

FOREIGN PATENT DOCUMENTS

| | | |
|---|---|---|
| JP | 2004-354554 A | 12/2004 |
| WO | 2016/158509 A1 | 10/2016 |

(Continued)

OTHER PUBLICATIONS

Jun. 1, 2021 Written Opinion issued in International Application No. PCT/JP2021/011230.

(Continued)

*Primary Examiner* — Vivian Chen
(74) *Attorney, Agent, or Firm* — Oliff PLC

(57) ABSTRACT

A composition for forming a resist underlayer film which enables to form a flat film with a favorable coating even on a so-called stepped substrate and a small film thickness difference after embedding, and also a polymer as an important component of the composition for forming a resist underlayer film, a resist underlayer film formed using the composition for forming a resist underlayer film, and a method of producing a semiconductor device. The composition for forming a resist underlayer film, includes a compound of the following Formula (1) and a solvent:

(1)

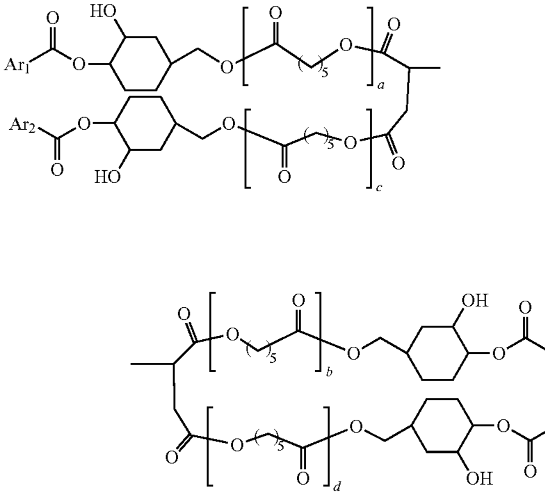

(wherein, $Ar_1$, $Ar_2$, $Ar_3$ and $Ar_4$ are each independently a substitutable monovalent aromatic hydrocarbon group, a, b, c, and d are each 0 or 1, and a+b+c+d=1).

4 Claims, No Drawings

(56) References Cited

U.S. PATENT DOCUMENTS

| | | | | |
|---|---|---|---|---|
| 2019/0079397 | A1* | 3/2019 | Endo | G03F 7/0236 |
| 2019/0171101 | A1* | 6/2019 | Tokunaga | C08G 59/68 |
| 2020/0225585 | A1 | 7/2020 | Endo et al. | |

FOREIGN PATENT DOCUMENTS

| | | | |
|---|---|---|---|
| WO | 2017/002653 | A1 | 1/2017 |
| WO | 2019/031556 | A1 | 2/2019 |
| WO | 2019/065262 | A1 | 4/2019 |

OTHER PUBLICATIONS

Jun. 1, 2021 International Search Report Issued in International Application No. PCT/JP2021/011230.

* cited by examiner

COMPOSITION FOR FORMING RESIST UNDERLAYER FILM

TECHNICAL FIELD

The present invention relates to a composition for forming a resist underlayer film which exhibits a favorable dry etching rate ratio and optical constant, and enables to form a flat film with a favorable coating even on a so-called stepped substrate and a small film thickness difference after embedding, a polymer as an important component of the composition for forming a resist underlayer film, a resist underlayer film formed using the composition for forming a resist underlayer film, and a method of producing a semiconductor device.

BACKGROUND ART

In recent years, resist underlayer film materials for multilayer resist processes have been required to function as an anti-reflective coating, particularly against short-wavelength exposure, to have an appropriate optical constant, and also to have an etching resistance in substrate processing, and use of a polymer having a repeating unit containing a benzene ring has been proposed (Patent Document 1).

PRIOR ART DOCUMENTS

Patent Documents

Patent Document 1: JP 2004-354554 A

SUMMARY OF THE INVENTION

Problems to be Solved by the Invention

A lithography process in which at least two resist underlayer films are formed, and the resist underlayer films are used as mask materials in order to make the resist layer thinner, which is required with miniaturization of resist patterns, is known. This is a method in which at least one organic film (lower-layer organic film) and at least one inorganic underlayer film are provided on a semiconductor substrate, the inorganic underlayer film is patterned using the resist pattern formed on an upper-layer resist film as a mask, and the lower-layer organic film is patterned using the pattern as a mask, and the pattern can be formed at a high aspect ratio. Examples of materials forming at least two resist underlayer films include combinations of organic resins (for example, an acrylic resin and a novolac resin), and inorganic materials (silicone resins (for example, organopolysiloxane), and inorganic silicon compounds (for example, SiON and $SiO_2$)). In addition, in recent years, a double patterning technique in which two lithography processes and two etching processes are performed in order to obtain one pattern has been widely applied, and the above multi-layer process is used in each process. In this case, the organic film formed after formation of the first pattern is required to have a property of flattening the step.

However, there are problems that a step coating of the composition for forming a resist underlayer film on a so-called stepped substrate in which there are differences in height, and denseness and sparseness in the resist pattern formed on a substrate to be processed, is insufficient, the film thickness difference after embedding is large, and it is difficult to form a flat film.

The present invention has been made in order to address such problems, and provides a composition for forming a resist underlayer film which exhibits a high etching resistance, and a favorable dry etching rate ratio and optical constant, and which enables to form a flat film with a favorable coating even on a so-called stepped substrate and a small film thickness difference after embedding. In addition, the present invention provides a polymer as an important component of the composition for forming a resist underlayer film, a resist underlayer film formed using the composition for forming a resist underlayer film, and a method of producing a semiconductor device.

Means for Solving the Problems

The present invention includes the following.

A first aspect of the present invention relates to a composition for forming a resist underlayer film, comprising a compound of the following Formula (1) and a solvent.

(1)

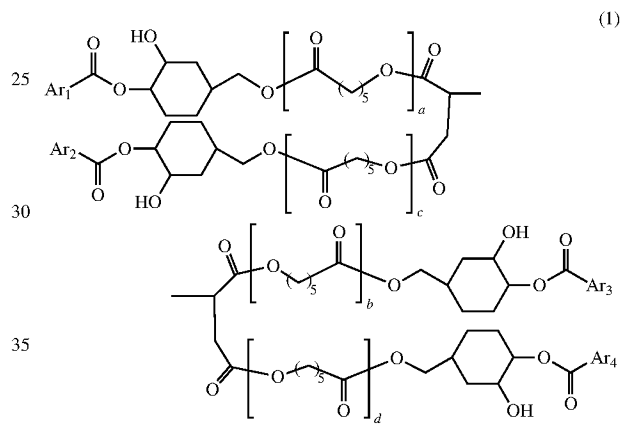

(wherein, $Ar_1$, $Ar_2$, $Ar_3$, and $Ar_4$ are each independently a substitutable monovalent aromatic hydrocarbon group, a, b, c, and d are each 0 or 1, and a+b+c+d=1).

A second aspect of the present invention relates to the composition for forming a resist underlayer film according to the first aspect in which the aromatic hydrocarbon group is a phenyl group, a naphthyl group, an anthracenyl group, a pyrenyl group or a combination thereof.

A third aspect of the present invention relates to the composition for forming a resist underlayer film according to the first aspect or the second aspect in which the aromatic hydrocarbon group is unsubstituted.

A fourth aspect of the present invention relates to the composition for forming a resist underlayer film according to the first aspect or the second aspect in which the aromatic hydrocarbon group is an aromatic hydrocarbon group of the following Formula (2) that binds to an alkyl substituent via an oxygen atom or directly:

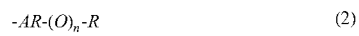

$$-AR-(O)_n-R \quad (2)$$

(Ar is an aromatic hydrocarbon group, n is 0 or 1, and R is an alkyl group having a carbon atom number of 1 to 19).

A fifth aspect of the present invention relates to the composition for forming a resist underlayer film according to any one of the first aspect to the fourth aspect in which the solvent is a solvent having a boiling point of 160° C. or higher.

A sixth aspect of the present invention relates to a resist underlayer film which is a baked product of a coating film composed of the composition for forming a resist underlayer film according to any one of the first aspect to the fifth aspect.

A seventh aspect of the present invention relates to a method of producing a semiconductor device, comprising:

a step of forming a resist underlayer film using the composition for forming a resist underlayer film according to any one of the first aspect to the fifth aspect on a semiconductor substrate;

a step of forming a resist film on the formed resist underlayer film;

a step of forming a resist pattern by emitting light or an electron beam to the formed resist film and performing development;

a step of etching and patterning the resist underlayer film with the formed resist pattern; and a step of processing the semiconductor substrate with the patterned resist underlayer film.

Effects of the Invention

Conventionally, it has been known that when an aromatic hydrocarbon is contained at the terminal of a skeleton of a polymer in a composition for forming a resist underlayer film, the composition for forming a resist underlayer film has insufficient coating on a stepped substrate, which results in disadvantages of a large coating step difference and low flatness. However, the inventors have found that the coating step difference can be effectively minimized by using a relatively low-molecular-weight compound containing a large amount of aromatic hydrocarbons at the terminal of the polymer skeleton, and completed the present invention.

Not only does the composition for forming a resist underlayer film of the present invention have a favorable dry etching rate ratio and optical constant, but the obtained resist underlayer film also forms a flat film with a favorable coating even on a so-called stepped substrate and a small film thickness difference after embedding, and thus finer substrate processing is achieved.

Particularly, the composition for forming a resist underlayer film of the present invention is effective in a lithography process in which at least two resist underlayer films are formed for thinning the resist film thickness and the resist underlayer film is used as an etching mask.

In addition, the composition for forming a resist underlayer film of the present invention has an appropriate anti-reflective effect, and a high dry etching rate for a resist film so that it can be used for substrate processing.

MODES FOR CARRYING OUT THE INVENTION

[Composition for Forming a Resist Underlayer Film]

A composition for forming a resist underlayer film according to the present invention is a composition for forming a resist underlayer film containing a compound of the following Formula (1) and a solvent.

(1)

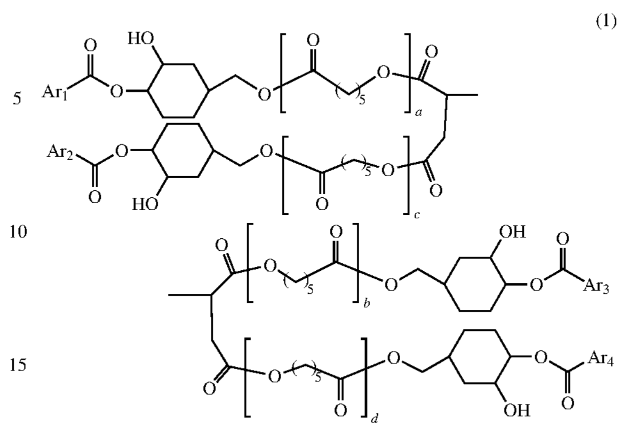

(wherein, $Ar_1$, $Ar_2$, $Ar_3$ and $Ar_4$ are each independently a substitutable monovalent aromatic hydrocarbon group, a, b, c, and d are each 0 or 1, and a+b+c+d=1).

The aromatic hydrocarbon group may be a phenyl group, a naphthyl group, an anthracenyl group, a pyrenyl group or a combination thereof.

In addition, the aromatic hydrocarbon group may be unsubstituted or may be one that binds to an alkyl substituent via an oxygen atom or directly.

In the aromatic hydrocarbon group having an alkyl substituent, as shown in the following Formula (2), Ar is an aromatic hydrocarbon group, n is 0 or 1, and R is a substituent.

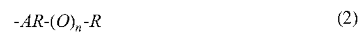

$$-AR-(O)_n-R \quad (2)$$

Specifically, Ar may be a phenyl group, a naphthyl group, an anthracenyl group, a pyrenyl group or a combination thereof. R may be a branched alkyl group, and some hydrogen atoms may be substituted with a hydroxyl group, a nitro group, a cyano group, or a halogen atom (a fluorine atom, a chlorine atom, a bromine atom, and an iodine atom).

Examples of alkyl groups include a $C_{1-19}$ alkyl group, for example, methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, n-heptyl group, 2-ethyl-hexyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, 2-heptyl-undecyl group, n-octadecyl group, n-nonadecyl group, 5,9-dimethyl-2-(6-methylheptyl) decyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

[Solvent]

The solvent for the composition for forming a resist underlayer film according to the present invention can be used without particular limitation as long as it is a solvent that can dissolve the above reaction product. Particularly, since the composition for forming a resist underlayer film according to the present invention is used in a uniform solution state, it is recommended to use a solvent generally used in a lithography process in consideration of its coating performance.

Examples of such solvents include methyl cellosolve acetate, ethyl cellosolve acetate, propylene glycol, propylene glycol monomethyl ether, propylene glycol monoethyl ether, methyl isobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butylate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents can be used alone or two or more thereof can be used in combination.

In addition, the following compound described in WO2018/131562A1 can be used.

Formula (i)

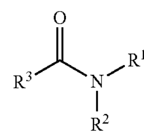

(in Formula (i), $R^1$, $R^2$ and $R^3$ are each independently a hydrogen atom, or a $C_{1-20}$ alkyl group which may be interrupted by an oxygen atom, a sulfur atom or an amide bond, and may be the same as or different from each other, and may be bonded to each other to form a ring structure).

Examples of $C_{1-20}$ alkyl groups include a linear or branched alkyl group which may or may not have a substituent, for example, methyl group, ethyl group, n-propyl group, isopropyl group, n-butyl group, sec-butyl group, tert-butyl group, n-pentyl group, isopentyl group, neopentyl group, n-hexyl group, isohexyl group, n-heptyl group, n-octyl group, cyclohexyl group, 2-ethylhexyl group, n-nonyl group, isononyl group, p-tert-butyl cyclohexyl group, n-decyl group, n-dodecyl nonyl group, undecyl group, dodecyl group, tridecyl group, tetradecyl group, pentadecyl group, hexadecyl group, heptadecyl group, octadecyl group, nonadecyl group and eicosyl group. Preferred is a $C_{1-12}$ alkyl group, more preferred is a $C_{1-8}$ alkyl group, and still more preferred is a $C_{1-4}$ alkyl group.

Examples of $C_{1-20}$ alkyl groups interrupted by an oxygen atom, a sulfur atom or an amide bond include those having a structural unit $—CH_2—O—$, $—CH_2—S—$, $—CH_2—NHCO—$ or $—CH_2—CONH—$. —O—, —S—, —NHCO— or —CONH— may be one unit or two or more units in the alkyl group. Specific examples of $C_{1-20}$ alkyl groups interrupted by a —O—, —S—, —NHCO— or —CONH— unit include methoxy group, ethoxy group, propoxy group, butoxy group, methylthio group, ethylthio group, propylthio group, butylthio group, methylcarbonylamino group, ethylcarbonylamino group, propylcarbonylamino group, butylcarbonylamino group, methylaminocarbonyl group, ethylaminocarbonyl group, propylaminocarbonyl group, and butylaminocarbonyl group, and additionally include a methyl group, ethyl group, propyl group, butyl group, pentyl group, hexyl group, heptyl group, octyl group, nonyl group, decyl group, dodecyl group and octadecyl group, each of which is substituted with a methoxy group, ethoxy group, propoxy group, butoxy group, methylthio group, ethylthio group, propylthio group, butylthio group, methylcarbonylamino group, ethylcarbonylamino group, methylaminocarbonyl group, ethylaminocarbonyl group or the like. A methoxy group, ethoxy group, methylthio group, or ethylthio group is preferable, and a methoxy group or ethoxy group is more preferable.

Since these solvents have relatively high boiling points, they are effective to impart an improved embedding property and high flatness to the composition for forming a resist underlayer film.

Specific examples of a preferable compound of Formula (i) are shown below.

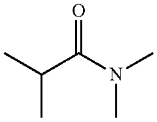

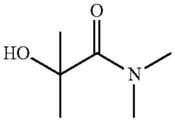

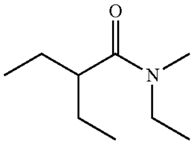

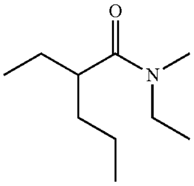

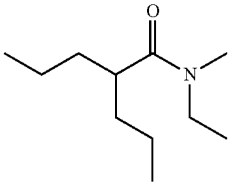

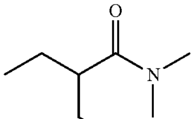

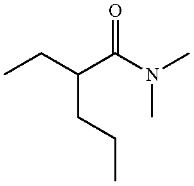

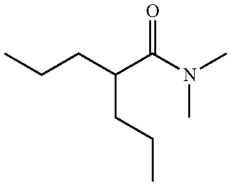

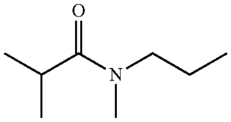

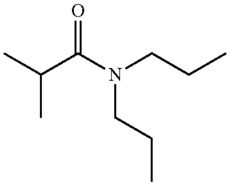

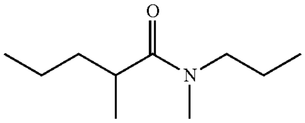

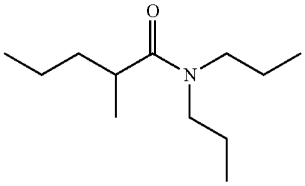

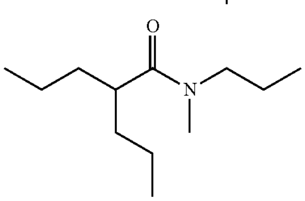

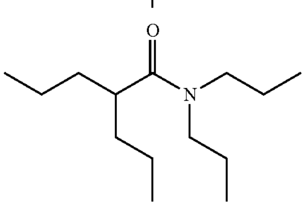

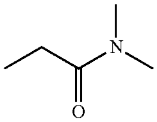

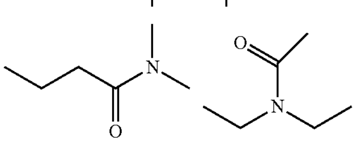

-continued

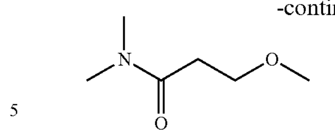

Among the above examples, 3-methoxy-N,N-dimethylpropionamide, N,N-dimethylisobutyramide, and a compound of the following formula:

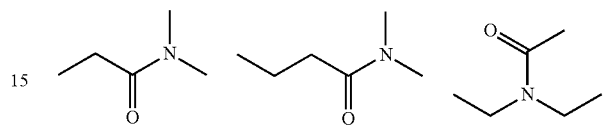

are preferable, and 3-methoxy-N,N-dimethylpropionamide and N,N-di methylisobutyramide are particularly preferable compounds of Formula (i).

These solvents can be used alone or two or more thereof can be used in combination. Among these solvents, those having a boiling point of 160° C. or higher are preferable, and preferable examples thereof include propylene glycol monomethyl ether, propylene glycol monomethyl ether acetate, ethyl lactate, butyl lactate, cyclohexanone, 3-methoxy-N,N-dimethylpropionamide, N,N-dimethylisobutyramide, 2,5-dimethylhexane-1,6-diyldiacetate (DAH; cas, 89182-68-3), and 1,6-diacetoxyhexane (cas, 6222-17-9). Particularly preferable examples thereof include propylene glycol monomethyl ether, propylene glycol monomethyl ether acetate, and N,N-dimethylisobutyramide.

[Cross-Linking Agent Component]

The composition for forming a resist underlayer film of the present invention may contain a cross-linking agent component. Examples of cross-linking agents thereof include a melamine-based agent, a substituted urea-based agent, and polymers thereof. A cross-linking agent having at least two crosslink forming substituents is preferable, and compounds such as methoxymethylated glycoluril (for example, tetramethoxymethyl glycoluril), butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea may be used. In addition, a condensate of these compounds can be used.

In addition, a cross-linking agent having a high heat resistance can be used as the cross-linking agent. As the cross-linking agent having a high heat resistance, a compound having a crosslink forming substituent having an aromatic ring (for example, a benzene ring, and a naphthalene ring) in the molecule can be preferably used.

Examples of this compound include a compound having a substructure of the following Formula (4) and a polymer or oligomer having a repeating unit of the following Formula (5).

Formula (4)

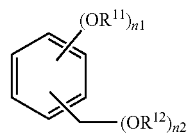

Formula (5)

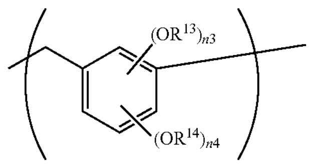

$R^{11}$, $R^{12}$, $R^{13}$, and $R^{14}$ are a hydrogen atom or a $C_{1-10}$ alkyl group, and the above examples can be used as these alkyl groups.

n1 is an integer satisfying 1≤n1≤6-n2, n2 is an integer satisfying 1≤n2≤5, n3 is an integer satisfying 1≤n3≤4−n4, and n4 is an integer satisfying 1≤n4≤3.

The compounds having a substructure of Formula (4) are exemplified below.

Formula (4-1)

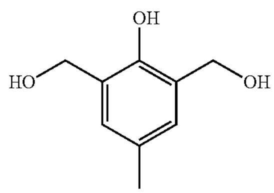

Formula (4-2)

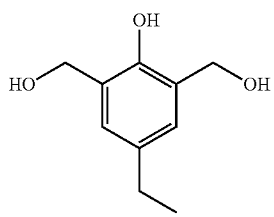

Formula (4-3)

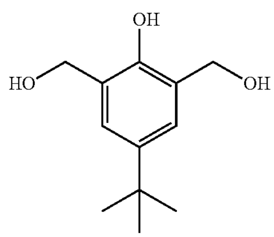

Formula (4-4)

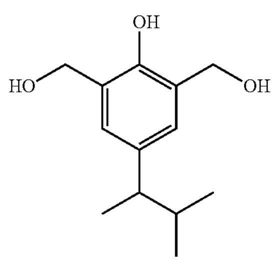

Formula (4-5)

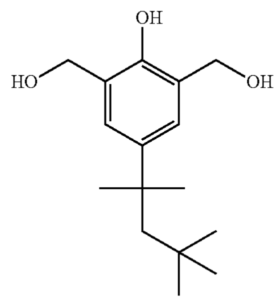

Formula (4-6)

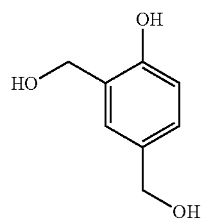

Formula (4-7)

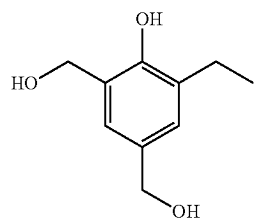

Formula (4-8)

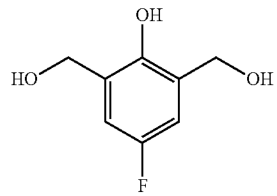

Formula (4-9)

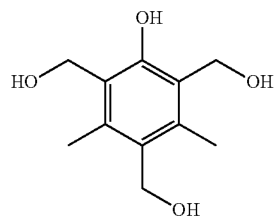

Formula (4-10)

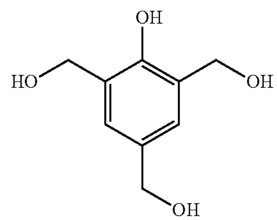

Formula (4-11)

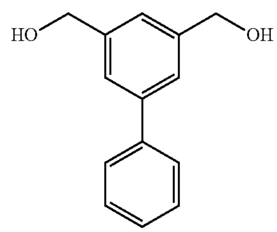

-continued
Formula (4-12)
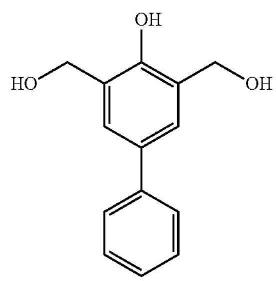
Formula (4-13)
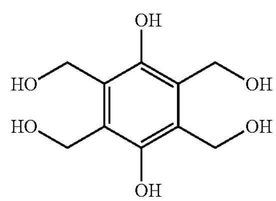
Formula (4-14)
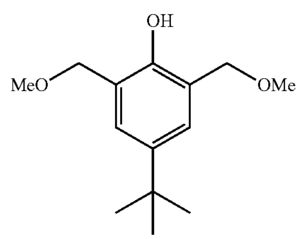
Formula (4-15)
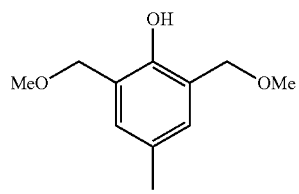
Formula (4-16)
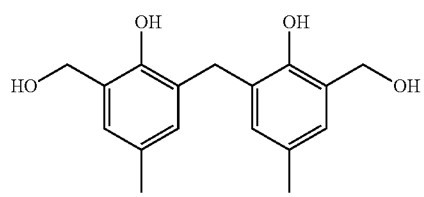
Formula (4-17)
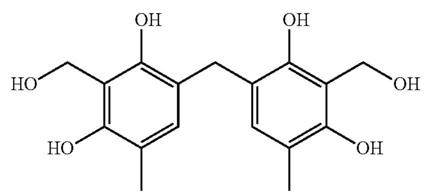
Formula (4-18)
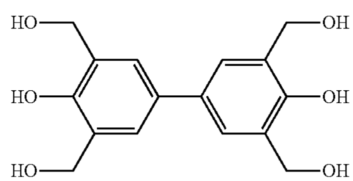
-continued
Formula (4-19)
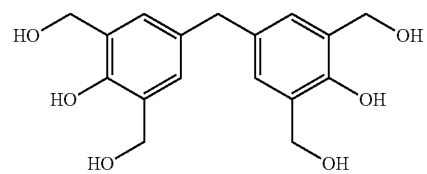
Formula (4-20)
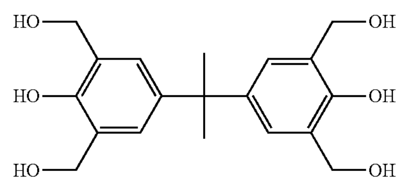
Formula (4-21)
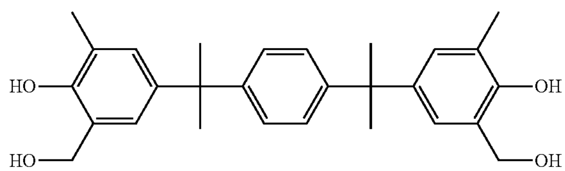
Formula (4-22)
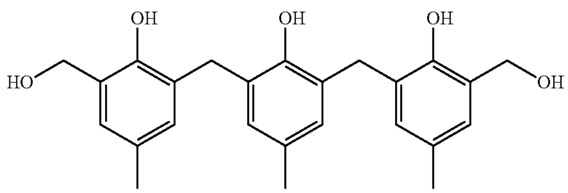
Formula (4-23)
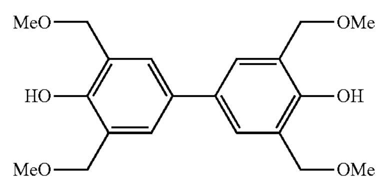
Formula (4-24)
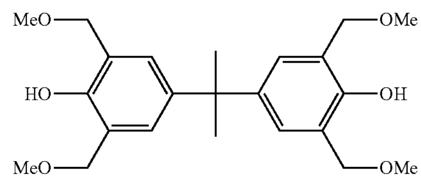
Formula (4-25)
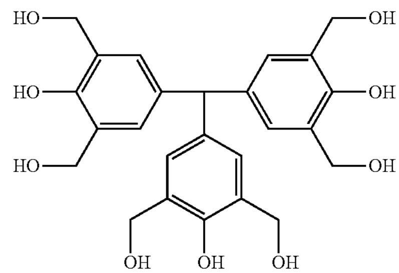

-continued

Formula (4-26)

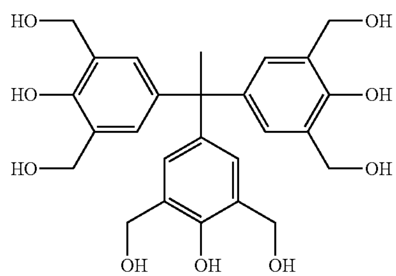

Formula (4-27)

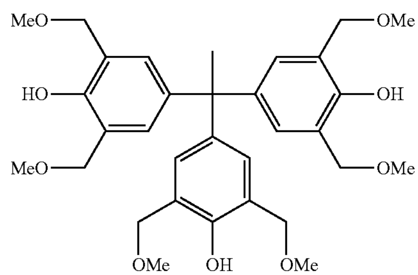

The above compounds can be obtained as products (commercially available from Asahi Yukizai Corporation and commercially available from Honshu Chemical Industry Co., Ltd.). For example, among the above cross-linking agents, the compound of Formula (4-24) can be obtained as a product named TM-BIP-A (commercially available from Asahi Yukizai Corporation).

The amount of the cross-linking agent added varies depending on a coating solvent used, a base substrate used, a required solution viscosity, a required film shape and the like, but is 0.001 to 80% by mass, preferably 0.01 to 50% by mass, and more preferably 0.05 to 40% by mass with respect to the total solid content. These cross-linking agents may cause a cross-linking reaction according to self-condensation, but when crosslinkable substituents are present in the reaction product of the present invention, the cross-linking agent can cause a cross-linking reaction with these cross-linkable substituents.

[Acid and/or Acid Generating Agent]

The composition for forming a resist underlayer film of the present invention can contain an acid and/or an acid generating agent.

Examples of acids include p-toluenesulfonic acid, trifluoromethane sulfonic acid, pyridinium p-toluene sulfonic acid, pyridinium phenol sulfonic acid, salicylic acid, 5-sulfosalicylic acid, 4-phenol sulfonic acid, camphor sulfonic acid, 4-chlorobenzene sulfonic acid, benzene disulfonic acid, 1-naphthalene sulfonic acid, citric acid, benzoic acid, hydroxybenzoic acid, and naphthalene carboxylic acid.

Acids can be used alone or two or more thereof can be used in combination. The amount of the acid added with respect to the total solid content is generally 0.0001 to 20% by mass, preferably 0.0005 to 10% by mass, and more preferably 0.01 to 3% by mass.

Examples of acid generating agents include a thermal acid generating agent and a photoacid generating agent.

Examples of thermal acid generating agents include 2,4,4,6-tetrabromocyclohexadienone, benzoin tosylate, 2-nitrobenzyl tosylate, K-PURE [registered trademark] CXC-1612, CXC-1614, TAG-2172, TAG-2179, TAG-2678, TAG2689, TAG2700 (commercially available from King Industries, Inc.), SI-45, SI-60, SI-80, SI-100, SI-110, SI-150 (commercially available from Sanshin Chemical Industry Co., Ltd.) and other organic sulfonic acid alkyl esters.

The photoacid generating agent generates an acid when the resist is exposed. Therefore, the acidity of the underlayer film can be adjusted. This is a method for adjusting the acidity of the underlayer film to the acidity of the upper-layer resist. In addition, the pattern shape of the resist formed on the upper layer can be adjusted by adjusting the acidity of the underlayer film.

Examples of photoacid generating agents contained in the composition for forming a resist underlayer film of the present invention include onium salt compounds, sulfonimide compounds, and disulfonyldiazomethane compounds.

Examples of onium salt compounds include iodonium salt compounds such as diphenyliodonium hexafluorophosphate, diphenyliodonium trifluoromethane sulfonate, diphenyliodonium nonafluoro normal butane sulfonate, diphenyliodonium perfluoro normal octane sulfonate, diphenyliodonium camphor sulfonate, bis(4-tert-butylphenyl) iodonium camphor sulfonate and bis(4-tert-butylphenyl)iodonium trifluoromethane sulfonate, and sulfonium salt compounds such as triphenylsulphonium hexafluoroantimonate, triphenylsulfonium nonafluoro normal butane sulfonate, triphenylsulfonium camphor sulfonate and triphenylsulfonium trifluoromethanesulfonate.

Examples of sulfonimide compounds include N-(trifluoromethanesulfonyloxy)succinimide, N-(nonafluoronormal butane sulfonyloxy)succinimide, N-(camphor sulfonyloxy) succinimide and N-(trifluoromethanesulfonyloxy)naphthalimide.

Examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The acid generating agents can be used alone or two or more thereof can be used in combination.

When an acid generating agent is used, the ratio thereof with respect to a solid content of 100 parts by mass of the composition for forming a resist underlayer film is 0.01 to 5 parts by mass, 0.1 to 3 parts by mass, or 0.5 to 1 part by mass.

[Other Components]

In the composition for forming a resist underlayer film of the present invention, in order to prevent pinholes, striations or the like from being generated and further improve coatability against surface unevenness, a surfactant can be added. Examples of surfactants include non-ionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene/polyoxypropylene block copolymers, sorbitan fatty acid esters such as, sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants such as Eftop EF301, EF303, and EF352 (product name, commercially available from Tochem Products Corporation), Megaface F171, F173, R-40, R-40N, and R-40LM (product name, commercially available from DIC Corporation), Fluorad FC430, and FC431 (product name, commercially available from Sumitomo 3M Limited.), AsahiGuard AG710, Surflon S-382, SC101, SC102, SC103, SC104, SC105, and SC106 (product name, commercially available from AGC Inc.), and organosiloxane polymer KP341 (commercially available from Shin-Etsu Chemical Co., Ltd.). The amount of the surfactant added with respect to a total solid content of the resist underlayer film material is generally 2.0% by mass or less, and preferably 1.0% by mass or less. These surfactants can be used alone or two or more thereof can be used in combination. When the surfactant is used, the ratio thereof with respect to a solid content of 100 parts by mass of the composition for forming a resist underlayer film is 0.0001 to 5 parts by mass, 0.001 to 1 part by mass, or 0.01 to 0.5 parts by mass.

In the composition for forming a resist underlayer film of the present invention, a light absorbing agent, a rheology adjusting agent, an adhesive auxiliary agent or the like can be added. The rheology adjusting agent is effective in improving the fluidity of the underlayer film forming composition. The adhesive auxiliary agent is effective in improving the adhesion between the semiconductor substrate or the resist and the underlayer film.

As the light absorbing agent, for example, commercially available light absorbing agents described in "Technology and Market of Industrial Dyes" (CMC publishing Co., Ltd.) and "Handbook of Dyes" (edited by The Society of Synthetic Organic Chemistry), for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; C. I. Pigment Brown 2 and the like can be suitably used. The light absorbing agent is generally added in a proportion of 10% by mass or less, and preferably 5% by mass or less with respect to a total solid content of the composition for forming a resist underlayer film.

The rheology adjusting agent is mainly added in order to improve the fluidity of the composition for forming a resist underlayer film, and particularly in a baking process, improve the uniformity of the film thickness of the resist underlayer film and improve the fillability of the composition for forming a resist underlayer film into the hole. Specific examples include phthalic acid derivatives such as dimethyl phthalate, diethyl phthalate, diisobutyl phthalate, dihexyl phthalate, and butylisodecyl phthalate, adipic acid derivatives such as dinormal butyl adipate, diisobutyl adipate, diisooctyl adipate, and octyldecyl adipate, maleic acid derivatives such as dinormal butyl malate, diethyl malate, and dinonyl malate, oleic acid derivatives such as methyl oleate, butyl oleate, and tetrahydrofurfuryl oleate, and stearic acid derivatives such as normal butyl stearate and glyceryl stearate. The rheology adjusting agent is generally added in a proportion of less than 30% by mass with respect to a total solid content of the composition for forming a resist underlayer film.

The adhesive auxiliary agent is mainly added in order to improve the adhesion between the substrate or the resist and the composition for forming a resist underlayer film, and prevent the resist from peeling off particularly during development. Specific examples include chlorosilanes such as trimethylchlorosilane, dimethylmethylolchlorosilane, methyldiphenylchlorosilane, and chloromethyldimethylchlorosilane, alkoxysilanes such as trimethylmethoxysilane, dimethyldiethoxysilane, methyldimethoxysilane, dimethylmethylolethoxysilane, diphenyldimethoxysilane, and phenyltriethoxysilane, silazanes such as hexamethyl disilazane, N,N'-bis(trimethylsilyl)urea, dimethyltrimethylsilylamine, and trimethylsilylimidazole, silanes such as methyloltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, ureas such as 1,1-dimethyl urea and 1,3-dimethyl urea, and thiourea compounds. The adhesive auxiliary agent is generally added in a proportion of less than 5% by mass, and preferably less than 2% by mass with respect to a total solid content of the composition for forming a resist underlayer film.

The solid content of the composition for forming a resist underlayer film according to the present invention is generally 0.1 to 70% by mass, and preferably 0.1 to 60% by mass. The solid content is the content of all components excluding the solvent from the composition for forming a resist underlayer film. The proportion of the reaction product in the solid content is preferably 1 to 100% by mass, 1 to 99.9% by mass, 50 to 99.9% by mass, 50 to 95% by mass, and 50 to 90% by mass in this order.

One scale for evaluating whether the composition for forming a resist underlayer film is in a uniform solution state is an observation of passability of a specific micro filter, and the composition for forming a resist underlayer film according to the present invention passes through a micro filter having a pore size of 0.1 m and exhibits a uniform solution state.

Examples of microfilter materials include fluorine resins such as polytetrafluoroethylene (PTFE), and tetrafluoroethylene/perfluoroalkyl vinyl ether (PFA) copolymers, polyethylene (PE), ultra-high-molecular-weight polyethylene (UPE), polypropylene (PP), polysulfone (PSF), polyethersulfone (PES), and nylon, and one made of polytetrafluoroethylene (PTFE) is preferable.

[Method of Producing Resist Underlayer Film and Semiconductor Device]

Hereinafter, a method of producing a resist underlayer film and a semiconductor device using the composition for forming a resist underlayer film according to the present invention will be described.

The composition for forming a resist underlayer film of the present invention is applied onto a substrate (for example, a silicon wafer substrate, a silicon/silicon dioxide-coated substrate, a silicon nitride substrate, a glass substrate, an ITO substrate, a polyimide substrate, and a low-dielectric constant material (low-k material)-coated substrate, etc.) used for producing a semiconductor device by an appropriate coating method such as using a spinner or a coater, and the resist underlayer film is then formed by baking. Baking conditions are appropriately selected from a baking temperature of 80° C. to 400° C. and a baking time of 0.3 to 60 minutes. Preferably, the baking temperature is 150° C. to 350° C., and the baking time is 0.5 to 2 minutes. Here, the film thickness of the underlayer film formed is, for example, 10 to 1,000 nm, 20 to 500 nm, 30 to 400 nm, or 50 to 300 nm.

In addition, an inorganic resist underlayer film (hard mask) can be formed on the organic resist underlayer film according to the present invention. For example, in addition to the method of forming the silicon-containing resist underlayer film (inorganic resist underlayer film) forming composition described in WO2009/104552A1 by spin coating, an Si-based inorganic material film can be formed by a CVD method or the like.

In addition, the composition for forming a resist underlayer film according to the present invention is applied onto a semiconductor substrate bearing a part having a step and a part having no step (so-called stepped substrate) and baked, and thus a resist underlayer film in which the step between the part having a step and the part having no step is in a range of 3 to 70 nm can be formed.

Next, a resist film, for example, a photoresist layer, is formed on the resist underlayer film. The photoresist layer can be formed by a well-known method, that is, application of the photoresist composition solution onto the underlayer film and subsequent baking. The film thickness of the photoresist is, for example, 50 to 10,000 nm, 100 to 2,000 nm, or 200 to 1,000 nm.

The photoresist to be formed on the resist underlayer film is not particularly limited as long as it is sensitive to light used for exposure. Both a negative type photoresist and a positive type photoresist can be used. Examples thereof include a positive type photoresist composed of a novolac resin and 1,2-naphthoquinone diazide sulfonic acid ester, a chemically amplified photoresist composed of a binder having a group that is decomposed by an acid to increase an alkali dissolution rate, and a photoacid generating agent, a chemically amplified photoresist composed of a low-molecular-weight compound that is decomposed by an acid to increase an alkali dissolution rate of a photoresist, an alkali-soluble binder and a photoacid generating agent, and a chemically amplified photoresist composed of a binder having a group that is decomposed by an acid to increase an alkali dissolution rate, a low-molecular-weight compound that is decomposed by an acid to increase an alkali dissolution rate of a photoresist, and a photoacid generating agent. For example, product name APEX-E (commercially available from Shipley Company L.L.C), product name PAR710 (commercially available from Sumitomo Chemical Co., Ltd.) and product name SEPR430 (commercially available from Shin-Etsu Chemical Co., Ltd.) may be exemplified. In addition, for example, fluorine-containing atomic polymer-based photoresists described in Proc. SPIE, Vol. 3999, 330-334 (2000), Proc. SPIE, Vol. 3999, 357-364 (2000), and Proc. SPIE, Vol. 3999, 365-374 (2000) may be exemplified.

Next, a resist pattern is formed by emitting light or an electron beam and development. First, exposure is performed through a predetermined mask. For exposure, near ultraviolet rays, far ultraviolet rays, extreme ultraviolet rays (for example, EUV (a wavelength of 13.5 nm), or the like are used. Specifically, a KrF excimer laser (a wavelength of 248 nm), an ArF excimer laser (a wavelength of 193 nm), an F2 excimer laser (a wavelength of 157 nm) or the like can be used. Among these, an ArF excimer laser (a wavelength of 193 nm) and EUV (a wavelength of 13.5 nm) are preferable. After exposure, a post exposure bake can be performed as necessary. The post exposure bake is performed under conditions appropriately selected from a heating temperature of 70° C. to 150° C. and a heating time of 0.3 to 10 minutes.

In addition, in the present invention, as the resist, a resist for electron beam lithography can be used instead of a photoresist. Both a negative type and a positive type can be used as the electron beam resist. Examples thereof include a chemically amplified resist composed of an acid generating agent and a binder having a group that is decomposed by an acid to change an alkali dissolution rate, a chemically amplified resist composed of an alkali-soluble binder, an acid generating agent and a low-molecular-weight compound that is decomposed by an acid to change an alkali dissolution rate of a resist, a chemically amplified resist composed of an acid generating agent, a binder having a group that is decomposed by an acid to change an alkali dissolution rate, and a low-molecular-weight compound that is decomposed by an acid to change an alkali dissolution rate of a resist, a non-chemically amplified resist composed of a binder having a group that is decomposed by an electron beam to change an alkali dissolution rate, and a non-chemically amplified resist composed of a binder having a moiety that is cut by an electron beam to change an alkali dissolution rate. Even when these electron beam resists are used, a resist pattern can be formed in the same manner as when a photoresist is used with an electron beam as a light emission source.

Next, development is performed with a developing solution. Accordingly, for example, when a positive type photoresist is used, the photoresist of the exposed part is removed, and the pattern of the photoresist is formed.

Examples of developing solutions include aqueous solutions containing alkaline metal hydroxides such as potassium hydroxide and sodium hydroxide, aqueous solutions containing quaternary ammonium hydroxides such as tetramethylammonium hydroxide, tetraethylammonium hydroxide, and choline, and alkaline aqueous solutions such as aqueous solutions containing amines such as ethanolamine, propylamine, and ethylenediamine. In addition, a surfactant and the like can be added to these developing solutions. The development conditions are appropriately selected from among a temperature of 5 to 50° C. and a time of 10 to 600 seconds.

Then, the inorganic underlayer film (intermediate layer) is removed using the pattern of the photoresist (upper layer) formed in this manner as a protective film, and the organic underlayer film (lower layer) is then removed using a film composed of the patterned photoresist and inorganic underlayer film (intermediate layer) as a protective film. Finally, the semiconductor substrate is processed using the patterned inorganic underlayer film (intermediate layer) and organic underlayer film (lower layer) as protective films.

First, the inorganic underlayer film (intermediate layer) of the part in which the photoresist has been removed, is removed by dry etching, and the semiconductor substrate is exposed. For dry etching of the inorganic underlayer film, gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane and dichloroborane can be used. For dry etching of the inorganic underlayer film, it is preferable to use a halogen-based gas, and more preferable to use fluorine gas. Examples of fluorine gases include tetrafluoromethane ($CF_4$), perfluorocyclobutane ($C_4F_8$), perfluoropropane ($C_3F_8$), trifluoromethane, and difluoromethane ($CH_2F_2$).

Then, the organic underlayer film is removed using the film composed of the patterned photoresist and inorganic underlayer film as a protective film. The organic underlayer film (lower layer) is preferably dry-etched using an oxygen-based gas. This is because the inorganic underlayer film containing a large amount of silicon atoms is unlikely to be removed by dry etching using an oxygen-based gas.

Finally, the semiconductor substrate is processed. The semiconductor substrate is preferably processed by dry etching using a fluorine gas.

Examples of fluorine gases include tetrafluoromethane ($CF_4$), perfluorocyclobutane ($C_4F_8$), perfluoropropane ($C_3F_8$), trifluoromethane, and difluoromethane ($CH_2F_2$).

In addition, an organic anti-reflective coating can be formed on the upper layer of the resist underlayer film before the photoresist is formed. The anti-reflective coating composition used here is not particularly limited, and one arbitrarily selected from among those commonly used in lithography processes can be used, and the anti-reflective coating can be formed by a commonly used method, for example, coating with a spinner or a coater and baking.

In the present invention, the organic underlayer film is formed on the substrate and the inorganic underlayer film is then formed thereon, and a photoresist can be additionally coated thereon. Thereby, the pattern width of the photoresist becomes narrower, and even if the photoresist is thinly coated to prevent pattern collapse, the substrate can be processed by selecting an appropriate etching gas. For example, it is possible to process the resist underlayer film using fluorine gas as an etching gas at a sufficiently high etching rate for the photoresist, it is possible to process the substrate using fluorine gas as an etching gas at a sufficiently high etching rate for the inorganic underlayer film, and it is also possible to process the substrate using an oxygen-based gas as an etching gas at a sufficiently high etching rate for the organic underlayer film.

Depending on the wavelength of light used in the lithography process, the resist underlayer film formed from the composition for forming a resist underlayer film may also absorb the light. Thus, in such a case, it can function as an anti-reflective coating having an effect of preventing reflected light from the substrate. In addition, the underlayer film formed from the composition for forming a resist underlayer film of the present invention can also function as a hard mask. The underlayer film of the present invention can also be used as a layer for preventing an interaction between the substrate and the photoresist, a layer having a function of preventing an adverse effect of the material used in the photoresist or the substance generated during exposure to the photoresist on the substrate, a layer having a function of preventing the substance generated from the substrate during heating and baking from diffusing into the upper-layer photoresist, a barrier layer for reducing the poisoning effect of the photoresist layer by a semiconductor substrate dielectric layer, or the like.

In addition, the underlayer film formed from the composition for forming a resist underlayer film can be applied to a substrate with a via hole formed that is used in a dual damascene process, and can be used as an embedding material that can fill the hole without gaps. In addition, it can also be used as a flattening material for flattening the uneven surface of the semiconductor substrate.

EXAMPLES

Hereinafter, specific examples of the composition for forming a resist underlayer film of the present invention will be described with reference to the following examples, but the present invention is not limited thereto.

The device used for measuring the weight average molecular weight of the reaction product obtained in the following synthesis example is shown.

Device: HLC-8320GPC commercially available from Tosoh Corporation

GPC column: TSKgel Super-MultiporeHZ-N (2 columns)

Column temperature: 40° C.

Flow rate: 0.35 ml/min

Eluent: THF

Standard sample: polystyrene

Synthesis Example 1

80.00 g of a 29.9 wt % PGME solution of Epolead GT401 (product name, commercially available from Daicel Corporation), 7.47 g of benzoic acid (commercially available from Tokyo Chemical Industry Co., Ltd.), 11.12 g of 9-anthracene carboxylic acid (commercially available from Midori Kagaku Co., Ltd.), and 1.03 g of ethyltriphenylphosphonium bromide as a catalyst were added to 45.54 g of propylene glycol monomethyl ether (hereinafter, in this specification, abbreviated as PGME), and the reaction was then performed at 140° C. for 24 hours to obtain a solution containing the reaction product. 43.55 g of an anion exchange resin (product name: DOWEX [registered trademark] MONOSPHERE [registered trademark] 550A, commercially available from Muromachi Technos Co., Ltd.) and 43.55 g of a cation exchange resin (product name: Amberlyst [registered trademark] 15JWET, commercially available from Organo Corporation) were added, and the mixture was stirred at 25° C. to 30° C. for 4 hours and then filtered.

When GPC analysis of the obtained reaction product was performed, the weight average molecular weight in terms of standard polystyrene was 1,400. The obtained reaction product is assumed to be a copolymer having a structural unit of the following Formula (A).

(A)

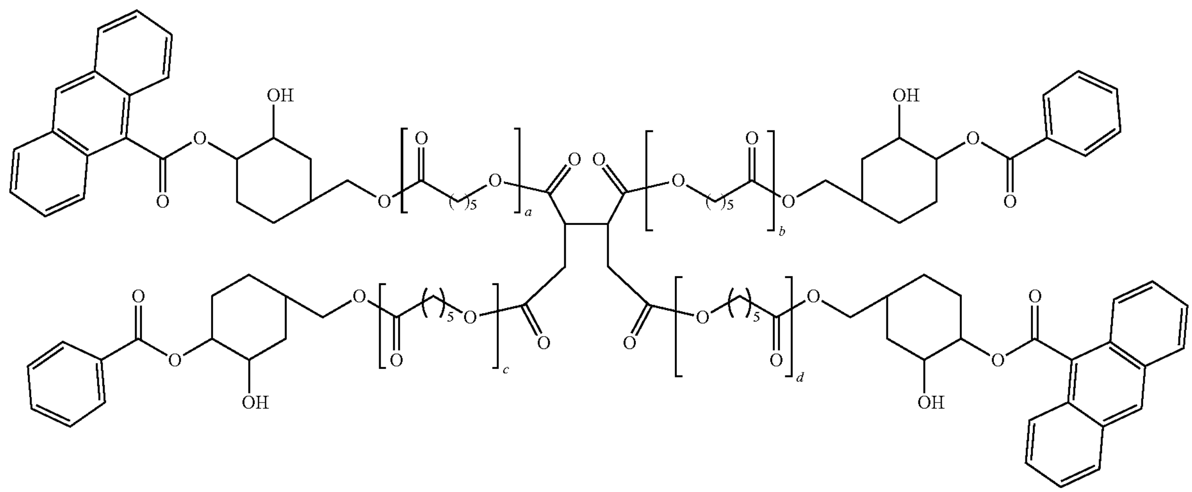

(a, b, c, and d are each 0 or 1, and a+b+c+d=1).

Synthesis Example 2

17.67 g of PGMEA, 5.00 g of EHPE-3150 (product name, commercially available from Daicel Corporation), 3.11 g of 9-anthracene carboxylic acid, 2.09 g of benzoic acid, and 0.62 g of ethyltriphenylphosphonium bromide as a catalyst were added to 7.57 g of PGME, and the mixture was heated to reflux for 13 hours under a nitrogen atmosphere. 16 g of a cation exchange resin (product name: Amberlyst [registered trademark]15JWET, commercially available from Organo Corporation) and 16 g of an anion exchange resin (product name: DOWEX [registered trademark] MONOSPHERE [registered trademark] 550A, commercially available from Muromachi Technos Co., Ltd.) were added to the obtained solution, and the mixture was stirred at 25° C. to 30° C. for 4 hours and then filtered.

When GPC analysis of the obtained reaction product was performed, the weight average molecular weight in terms of standard polystyrene was 4,700. The obtained reaction product is assumed to be a copolymer having a structural unit of the following Formula (B).

(B)

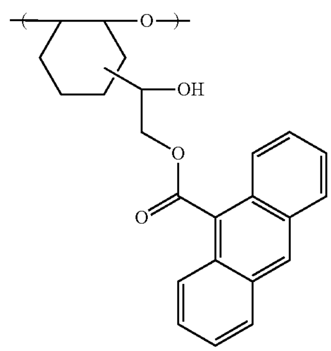

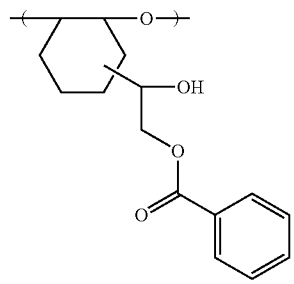

Synthesis Example 3

35.00 g of EPPN-501H (product name, commercially available from Nippon Kayaku Co., Ltd.), 34.25 g of 2-hexyldecanoic acid (commercially available from Tokyo Chemical Industry Co., Ltd.), and 1.24 g of ethyltriphenylphosphonium bromide as a catalyst were added to 164.47 g of PGME and the reaction was then performed at 140° C. for 24 hours to obtain a solution containing the reaction product. 70.50 g of an anion exchange resin (product name: DOWEX [registered trademark] MONOSPHERE [registered trademark]550A, commercially available from Muromachi Technos Co., Ltd.) and 70.50 g of a cation exchange resin (product name: Amberlyst [registered trademark] 15JWET, commercially available from Organo Corporation) were added, and the mixture was stirred at 25° C. to 30° C. for 4 hours and then filtered.

When GPC analysis of the obtained reaction product was performed, the weight average molecular weight in terms of standard polystyrene was 2,200. The obtained reaction product is assumed to be a copolymer having a structural unit of the following Formula (C).

(C)

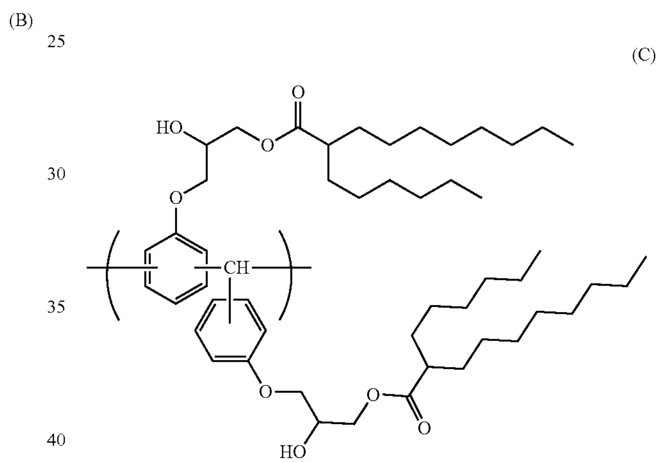

Synthesis Example 4

15.00 g of EPICLON HP-4700 (product name, commercially available from DIC Corporation), 9.32 g of 9-anthracene carboxylic acid, 11.99 g of 4-(heptyloxy)benzoic acid (commercially available from Sanuki Chemical Industry Co., Ltd.), and 0.86 g of ethyltriphenylphosphonium bromide as a catalyst were added to 86.52 g of PGME, and the reaction was then performed at 140° C. for 24 hours to obtain a solution containing the reaction product. 37.08 g of an anion exchange resin (product name: AMBERJET [registered trademark] ESG4002 (OH), commercially available from Organo Corporation) and 37.08 g of a cation exchange resin (product name: Amberlyst [registered trademark] 15JWET, commercially available from Organo Corporation) were added, and the mixture was stirred at 25° C. to 30° C. for 4 hours and then filtered.

When GPC analysis of the obtained reaction product was performed, the weight average molecular weight in terms of standard polystyrene was 1,600. The obtained reaction product is assumed to be a copolymer having a structural unit of the following Formula (D).

(D)

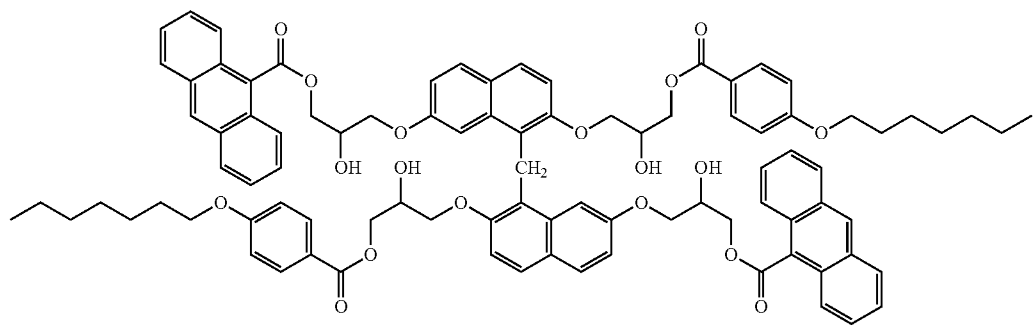

[Preparation of Composition for Forming Resist Underlayer Film]

Example 1

4.24 g of tetramethoxymethyl glycoluril (product name: POWDERLINK [registered trademark] 1174, commercially available from Nihon Cytec Industries Inc.), 12.73 g of PGME solution containing 1% by mass of pyridinium p-toluenesulfonate, 265.45 g of PGME, and 1.27 g of a PGME solution containing 1% by mass of surfactant (product name: R-30N, commercially available from DIC Corporation) were mixed with 66.31 g of a solution (the solvent was PGME used during synthesis, and the solid content was 25.59% by mass) containing 16.97 g of the copolymer obtained in Synthesis Example 1, and thereby a 6.10% by mass solution was obtained. This solution was filtered using a polytetrafluoroethylene micro filter having a pore size of 0.2 m to prepare a composition for forming a resist underlayer film.

Comparative Example 1

1.14 g of tetramethoxymethyl glycoluril (product name: POWDERLINK [registered trademark] 1174, commercially available from Nihon Cytec Industries Inc.), 3.41 g of a PGME solution containing 1% by mass of pyridinium p-toluenesulfonate, 50.68 g of PGME, 14.80 g of PGMEA, and 0.45 g of a PGME solution containing 1% by mass of surfactant (product name: R-30, commercially available from DIC Corporation) were mixed with 19.52 g of a solution (the solvent was a PGME/PGMEA mixed solvent used during syntheses, and the solid content was 23.26% by mass) containing 4.51 g of the copolymer obtained in Synthesis Example 2, and thereby a 6.35% by mass solution was obtained. This solution was filtered using a polytetrafluoroethylene micro filter having a pore size of 0.2 m to prepare a composition for forming a resist underlayer film.

Comparative Example 2

4.87 g of tetramethoxymethyl glycoluril (product name: POWDERLINK [registered trademark] 1174, commercially available from Nihon Cytec Industries Inc.), 14.60 g of a PGME solution containing 1% by mass of pyridinium p-toluenesulfonate, 156.91 g of PGME, 97.65 g of PGMEA, and 1.95 g of a PGME solution containing 1% by mass of surfactant (product name: R-30N, commercially available from DIC Corporation) were mixed with 74.02 g of a solution (the solvent was PGME used during synthesis, and the solid content was 26.30% by mass) containing 19.48 g of the copolymer obtained in Synthesis Example 3, and thereby a 7.00% by mass solution was obtained. This solution was filtered using a polytetrafluoroethylene micro filter having a pore size of 0.2 m to prepare a composition for forming a resist underlayer film.

Comparative Example 3

0.89 g of tetramethoxymethyl glycoluril (product name: POWDERLINK [registered trademark] 1174, commercially available from Nihon Cytec Industries Inc.), 2.68 g of a PGME solution containing 1% by mass of pyridinium p-toluenesulfonate, 33.50 g of PGME, and 0.27 g of a PGME solution containing 1% by mass of surfactant (product name: R-30N, commercially available from DIC Corporation) were mixed with 12.65 g of a solution (the solvent was PGME used during synthesis, and the solid content was 28.27% by mass) containing 3.58 g of the copolymer obtained in Synthesis Example 4, and thereby a 6.21% by mass solution was obtained. This solution was filtered using a polytetrafluoroethylene micro filter having a pore size of 0.2 m to prepare a composition for forming a resist underlayer film.

[Test for Elution in Photoresist Solvent]

The compositions for forming a resist underlayer film prepared in Example 1, and Comparative Example 1 to Comparative Example 3 were applied onto a silicon wafer by a spinner. Then, a resist underlayer film (a film thickness of 0.2 m) was formed by performing baking on a hot plate at a temperature shown in the following Table 1 for 1 minute. These resist underlayer films were immersed in a PGME/PGMEA mixed solvent (the mixing ratio was PGME/PGMEA 70/30), which is a solvent used in a photoresist solution, and it was confirmed that they were insoluble in the solvent, and the results are shown as "O" in the following Table 1.

[Optical Parameter Test]

The compositions for forming a resist underlayer film prepared in Example 1, and Comparative Example 1 to Comparative Example 3 were applied onto a silicon wafer by a spinner. Then, a resist underlayer film (a film thickness of 0.2 μm) was formed by performing baking on a hot plate at a temperature shown in the following Table 1 for 1 minute. Then, the refractive index (n value) and the attenuation coefficient (k value) of these resist underlayer films were measured using an optical ellipsometer (VUV-VASE VU-302, commercially available from J. A. Woollam Co. Inc.) at a wavelength of 193 nm. The results are shown in the following Table 1. In order for the resist underlayer film to have a sufficient anti-reflective function, the k value at a wavelength of 193 nm is desirably 0.1 or more and 0.5 or less.

TABLE 1

| | Baking temper-ature (deg. C.) | Solvent resistance PGME/PGMEA 70/30 | Optical parameter 193 nm n value | k value | Flatness |
|---|---|---|---|---|---|
| Example 1 | 215 | ○ | 1.66 | 0.24 | ○ |
| Comparative Example 1 | 215 | ○ | 1.64 | 0.26 | X |
| Comparative Example 2 | 215 | ○ | 1.59 | 0.22 | X |
| Comparative Example 3 | 215 | ○ | 1.57 | 0.23 | X |

[Test for Coating on Stepped Substrate]

For evaluation of flatness, coating film thicknesses of a trench pattern area (TRENCH) having a trench width of 10 nm and a pitch of 100 nm and that of an isotrench pattern area (ISO) having a trench width of 100 nm and a pitch of 10 m on an $SiO_2$ substrate having a film thickness of 100 nm were compared. The compositions for forming a resist underlayer film of Example 1, and Comparative Example 1 to Comparative Example 3 were applied onto the substrate at a film thickness of 240 nm and then baked on a hot plate at a temperature shown in Table 1 for 1 minute to form a resist underlayer film (a film thickness of 0.24 m). The step coating of the substrate was observed using a scanning electron microscope (S-4800) (commercially available from Hitachi High-Tech Corporation), and the flatness was evaluated by measuring the film thickness difference (the coating step difference between the trench area and the iso area, which is called Bias) between the trench area (pattern part) and the iso area (pattern-free part) of the stepped substrate. Table 2 shows the values of the film thickness and the coating step of each area. In the flatness evaluation, a smaller Bias value indicates higher flatness.

TABLE 2

| | Trench Film thickness (nm) | Iso Film thickness (nm) | Trench/Iso Coating step difference (nm) |
|---|---|---|---|
| Example 1 | 238 | 208 | 30 |
| Comparative Example 1 | 260 | 222 | 38 |
| Comparative Example 2 | 284 | 226 | 58 |
| Comparative Example 3 | 242 | 204 | 38 |

Comparing the flatness in the results of Example 1, since the coating step difference between the pattern area and the open area was smaller than that of the results of Comparative Example 1 to Comparative Example 3, it can be said that the resist underlayer film obtained from the composition for forming a resist underlayer film of Example 1 had a favorable flatness.

In addition, the composition for forming a resist underlayer film of Example 1 had a favorable storage stability, the resist underlayer film obtained from the composition exhibited a favorable etching resistance, and the heat resistance of the film during baking was favorable. Further, there is an advantage of a small amount of sublimate during baking.

INDUSTRIAL APPLICABILITY

The composition for forming a resist underlayer film of the present invention can be applied flatly even on a substrate having a step and a flat film can be formed. In addition, since it has an appropriate anti-reflective effect, it is beneficial as a composition for forming a resist underlayer film.

The invention claimed is:

1. A composition for forming a resist underlayer film, the composition comprising a compound of the following Formula (1) and a solvent:

(1)

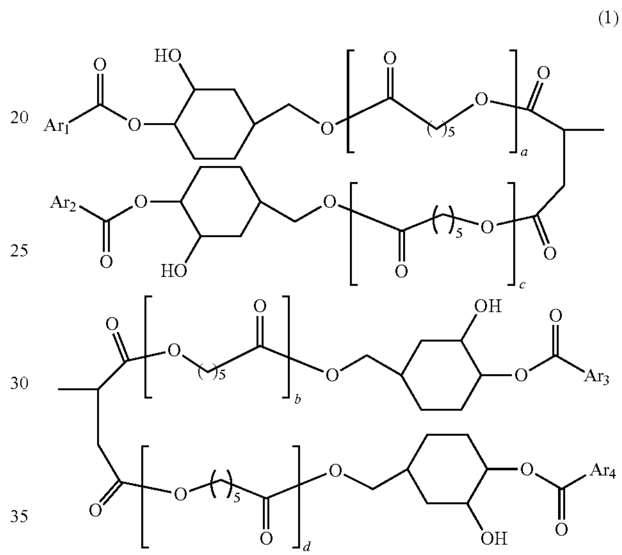

wherein, $Ar_1$, $Ar_2$, $Ar_3$ and $Ar_4$ are each independently an aromatic hydrocarbon group selected from the group consisting of a phenyl group, a naphthyl group, an anthracenyl group, a pyrenyl group and combinations thereof, each being unsubstituted.

2. The composition for forming a resist underlayer film according to claim 1, wherein the solvent is a solvent having a boiling point of 160° C. or higher.

3. A resist underlayer film which is a baked product of a coating film composed of the composition for forming a resist underlayer film according to claim 1.

4. A method of producing a semiconductor device, comprising:

a step of forming a resist underlayer film using the composition for forming a resist underlayer film according to claim 1 on a semiconductor substrate;

a step of forming a resist film on the formed resist underlayer film;

a step of forming a resist pattern by emitting light or an electron beam to the formed resist film and performing development;

a step of etching and patterning the resist underlayer film with the formed resist pattern; and a step of processing the semiconductor substrate with the patterned resist underlayer film.

* * * * *